(12) United States Patent
Kondo et al.

(10) Patent No.: US 7,728,508 B2
(45) Date of Patent: Jun. 1, 2010

(54) LIGHT EMITTING DIODE WITH FLUORESCENT MATERIAL

(75) Inventors: Kenichi Kondo, Tokyo (JP); Shuichi Taya, Tokyo (JP); Yasuyuki Miyake, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 1341 days.

(21) Appl. No.: 11/146,354

(22) Filed: Jun. 7, 2005

(65) Prior Publication Data

US 2005/0276995 A1    Dec. 15, 2005

(30) Foreign Application Priority Data

Jun. 11, 2004    (JP) .............................. 2004-173845

(51) Int. Cl.
*H01J 1/62*    (2006.01)
*H01J 63/04*    (2006.01)

(52) U.S. Cl. ...................... 313/503; 313/498; 313/501; 313/506

(58) Field of Classification Search .......... 313/498–512
See application file for complete search history.

(56) References Cited

U.S. PATENT DOCUMENTS

| | | | | |
|---|---|---|---|---|
| 6,066,861 A | 5/2000 | Hohn et al. | .................... | 257/99 |
| 6,245,259 B1 | 6/2001 | Hohn et al. | ............. | 252/301.36 |
| 6,277,301 B1 | 8/2001 | Hohn et al. | ............. | 252/301.36 |
| 6,576,930 B2 | 6/2003 | Reeh et al. | .................... | 257/98 |
| 6,592,780 B2 | 7/2003 | Hohn et al. | ............. | 252/301.36 |
| 6,613,247 B1 | 9/2003 | Hohn et al. | ............. | 252/301.36 |
| 6,669,866 B1 | 12/2003 | Kummer et al. | ....... | 252/301.4 R |

(Continued)

FOREIGN PATENT DOCUMENTS

JP            10-190065         7/1998

(Continued)

OTHER PUBLICATIONS

Office Action from Chinese Patent App. No. 200510071930.7 (Nov. 9, 2007).

(Continued)

*Primary Examiner*—Bumsuk Won
*Assistant Examiner*—Kevin Quarterman
(74) *Attorney, Agent, or Firm*—Cermak Kenealy Vaidya & Nakajima LLP

(57) ABSTRACT

A light-emitting device can be configured to have little variation in light emission characteristics even at increased temperatures. A light-emitting device can include a light-emitting section for emitting light with a predetermined wavelength, and a fluorescent material for absorbing a part of light emitted from the light-emitting section and emitting light with a longer wavelength. The light-emitting device can mix the light with the predetermined wavelength from the light-emitting section and the light with the longer wavelength from the fluorescent material, and thereby emit a mixed light. The fluorescent material can include single crystal grains in which primary grains have a diameter of 1 μm or less. Crystal defects, such as a grain boundary, do not often and sometimes never occur in the single crystal grain having a diameter of 1 μm or less. Thus, it is possible to restrain a phenomenon in which a crystal defect non-radially emits absorbed energy (as heat) which then reduces light emission efficiency.

6 Claims, 4 Drawing Sheets

U.S. PATENT DOCUMENTS

| | | | |
|---|---|---|---|
| 6,774,401 B2 | 8/2004 | Nakada et al. | 257/82 |
| 6,809,342 B2 | 10/2004 | Harada | 257/79 |
| 6,812,500 B2 | 11/2004 | Reeh et al. | 257/98 |
| 2007/0108896 A1* | 5/2007 | Hirosaki | 313/506 |

FOREIGN PATENT DOCUMENTS

| | | | |
|---|---|---|---|
| JP | 2000-208815 | | 7/2000 |
| JP | 2000204368 | | 7/2000 |
| JP | 2000297279 A | * | 10/2000 |
| JP | 2001-127346 | | 5/2001 |
| JP | 2001-196639 | | 7/2001 |
| JP | 2001-210872 | | 8/2001 |
| JP | 2001-345483 | | 12/2001 |
| JP | 2004-056075 | | 2/2004 |
| JP | 2004115621 | | 4/2004 |
| JP | 2004115621 A | * | 4/2004 |

OTHER PUBLICATIONS

Office Action from Chinese Patent App. No. 200510071930.7 (May 9, 2008).

* cited by examiner

LIGHT EMITTING DIODE WITH FLUORESCENT MATERIAL

This application claims the priority benefit under 35 U.S.C. §119 of Japanese Patent Application No. 2004-173845 filed on Jun. 11, 2004, which is hereby incorporated by reference.

BACKGROUND OF THE INVENTION

1. Field of the Invention

The present invention relates to a light-emitting device which performs wavelength conversion with the use of a fluorescent material.

2. Description of the Related Art

A light-emitting diode is practically used in industrial products as a compact and lightweight light source which emits light with high efficiency. Light emission from the light-emitting diode, however, has a narrow spectral width, and hence it is difficult impossible to obtain white light from a single device. Accordingly, a light-emitting device for obtaining white light with a wide spectral width by mixing blue light and yellow light has been proposed (for example, Japanese Patent Laid-Open Publication No. 2000-208815), and is practically used. The light-emitting device includes a blue light-emitting diode and a fluorescent material for absorbing blue light and for emitting yellow light.

The following can be used for the fluorescent material for emitting yellow light: an yttrium aluminum garnet fluorescent material activated by Ce ($Y_3Al_5O_{12}$:Ce, $(Y,Gd)_3Al_5O_{12}$:Ce, or the like); a terbium aluminum garnet fluorescent material activated by Ce ($Tb_3Al_5O_{12}$:Ce or the like); an alkaline earth metal orthosilicate fluorescent material activated by Eu (($Sr,Ca,Ba)SiO_4$:Eu or the like), or the like. These materials absorb light emission from the blue light-emitting diode, and emit yellowish fluorescent light.

To manufacture these fluorescent materials, oxide particles and/or metallic salt are/is combined and mixed in accordance with the composition ratio of a desired fluorescent material. A mixture is put into a crucible made of ceramic with flux or the like. The mixture and the flux are subjected to heat treatment at high temperatures in an atmospheric atmosphere or a reduction atmosphere, to prepare a fluorescent material with desired composition by baking. According to this method, the diameter of crystal grains of the fluorescent material grows to several μm or more by baking. The resulting grains of the fluorescent material become a material for a light-emitting diode, after being cleaned, dried, and sized by crushing and by a sieve that evens their diameters. This method makes it possible to manufacture the fluorescent material in quantity. The manufactured fluorescent material is dispersed in a transparent resin, and the resin is charged into a case in which the blue light-emitting diode is disposed. Thus, a white light-emitting diode is manufactured.

The fluorescent material used in the conventional white light-emitting diode has extremely high light conversion efficiency at ambient temperature. There is a problem, however, in that the light conversion efficiency decreases at high temperatures. In this case, if the electric current density of the blue light-emitting diode is increased to increase the intensity of light emission, the light emission efficiency of the fluorescent material is decreased due to heat from the blue light-emitting diode. Thus, yellow light is reduced, so that the color of light emitted from the diode is bluish white. In a like manner, the color of emitted light changes when the ambient temperature is increased. As described above, reduction in the light emission efficiency of the fluorescent material in an environment at high temperatures is a phenomenon called "temperature quenching," and there was no effective method for resolving it.

In the conventional white light-emitting diode, there were cases where the density of the fluorescent material charged into the case was biased in the resin. Thus, there were problems of unevenness in luminance and unevenness in the color of emitted light. The unevenness in the color of emitted light was a critical defect in applying the white light-emitting diode to a backlighting source for liquid crystal display. When a product emitted a color of light that was out of a predetermined chromaticity range, the product was rejected as defective. Therefore, product yield was low and there was much waste.

SUMMARY OF THE INVENTION

In accordance with an aspect of the invention a light-emitting device can be configured to have little variation in light emission characteristics if/when temperature is increased.

According to another aspect of the invention, a fluorescent material can include single crystal grains in which primary grains thereof have a diameter of 1 μm or less. A crystal defect, such as a grain boundary, hardly occurs in the single crystal grains having a diameter of 1 μm or less. Thus, it is possible to restrain a phenomenon in which a crystal defect non-radially emits absorbed energy (as heat) and in which light emission efficiency is reduced.

According to another aspect of the invention, the diameter of grains of the fluorescent material may exceed 1 μm as long as the grains are single crystal grains in which a grain boundary does not exist in a primary grain.

The primary grains may form secondary grains by melting, agglomeration, or the like. The secondary grain may have a diameter of 5 μm or more. When a fluorescent material in a state of the secondary grains is used, the handling of the fluorescent material becomes easy.

According to a further aspect of the invention, the fluorescent material may include fine grains generated by heating an ingredient solution containing a polymer. The ingredient solution can include a polymeric material and another ingredient dissolved in a predetermined solvent. A crystal defect rarely occurs in the fine grain of the fluorescent material manufactured in this method. Thus, it is possible to restrain a phenomenon in which a crystal defect non-radially emits absorbed energy and in which light emission efficiency is reduced. For example, single crystal grains in which primary grains thereof have a diameter of 1 μm or less can be available. The primary grains may form secondary grains having a diameter of 5 μm or more.

According to a further aspect of the invention, there can be provided a light-emitting device that includes: a substrate having a pair of electrodes; a light-emitting section connected to the pair of electrodes and disposed on the substrate, the light-emitting section emitting light with a predetermined wavelength; a light conversion section formed so as to surround the light-emitting section, the light conversion section including a fluorescent material, the fluorescent material absorbing at least a part of light emitted from the light-emitting section and converting the light into light with a longer wavelength, the fluorescent material including single crystal grains in which primary grains thereof have a diameter of 1 μm or less.

According to a still further aspect of the invention, there is provided a light-emitting device that can include: a substrate having a pair of electrodes; a light-emitting section connected to the pair of electrodes and disposed on the substrate, the light-emitting section emitting light with a predetermined wavelength; a light conversion section formed so as to surround the light-emitting section, the light conversion section including a fluorescent material, the fluorescent material absorbing at least a part of light emitted from the light-emitting section and converting the light into light with a longer wavelength, the fluorescent material including single crystal grains in which a grain boundary does not exist in primary grains thereof.

According to yet a further aspect of the invention, there is provided a light-emitting device that can include: a substrate having a pair of electrodes; a light-emitting section connected to the pair of electrodes and disposed on the substrate, the light-emitting section emitting light with a predetermined wavelength; a light conversion section formed so as to surround the light-emitting section, the light conversion section including a fluorescent material, the fluorescent material absorbing at least a part of light emitted from the light-emitting section and converting the light into light with a longer wavelength, the fluorescent material including fine grains generated by heating an ingredient solution, the ingredient solution including a particular ingredient and a polymeric material dissolved in a predetermined solvent.

The foregoing light-emitting devices may further include a reflecting section mounted on the substrate so as to surround the light-emitting section. The reflecting section can reflect the light emitted from the light-emitting section and the light from the light conversion section.

In the foregoing light-emitting devices, the fluorescent material may include secondary grains formed by the primary grains and having a diameter of 5 μm or more.

BRIEF DESCRIPTION OF THE DRAWINGS

These and other features and advantages of the invention will become clear from the following description with reference to the accompanying drawings, wherein.

DETAILED DESCRIPTION OF PREFERRED EMBODIMENTS

Embodiments of a light-emitting device made in accordance with the principles of the invention will be hereinafter described with reference to the accompanying drawings.

Figure 1:
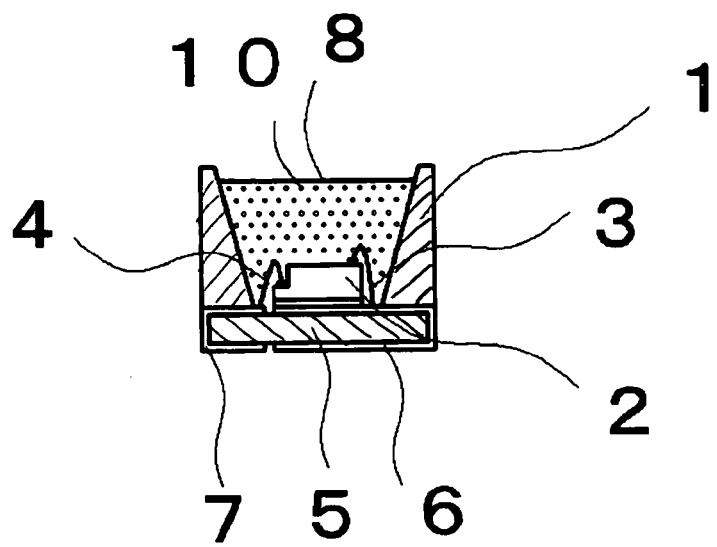
FIG. 1 is a sectional view showing the structure of an embodiment of a light-emitting device made in accordance with the principles of the invention.

Referring to FIG. 1, a light-emitting device can include a substrate 5, a blue light-emitting diode 2, a case 1, and a charged section 8. The blue light-emitting diode 2 can be disposed in the center of the substrate 5. The case 1 can be mounted on the substrate 5 and designed so as to surround the blue light-emitting diode 2. The charged section 8 refers to space inside the case 1 into which a resin such as an epoxy resin can be charged.

A fluorescent material 10 can be dispersed in the resin in the charged section 8. The fluorescent material 10 can absorb a part of blue light emitted from the blue light-emitting diode 2, and can emit yellow light.

The dominant wavelength of light emitted from the blue light-emitting diode 2 can be, for example, 465 nm.

The substrate 5 can be made of a resin. Electrodes 6 and 7 can be made of silver-plated copper and disposed on the substrate. The electrodes 6 and 7 can be connected to electrode terminals of the blue light-emitting diode 2 with gold wires 3 and 4.

The case 1 (reflecting section) can be made of a resin with high reflectivity. The case 1 can reflect the blue light emitted from the blue light-emitting diode 2 and the yellow light emitted from the fluorescent material 10, so that the blue light and the yellow light are emitted from the top face of the charged section 8 to the outside. Accordingly, white light which is a mixture of the blue light and the yellow light can be emitted from the top face of the charged section 8.

For example, $(Y,Gd)_3Al_5O_{12}$:Ce can be used as the fluorescent material 10. This is a composition in which Gd substitutes for a part of Y atoms in a crystal of $Y_3Al_5O_{12}$ generally known as YAG, and then a small amount of Ce is doped. The fluorescent material 10 absorbs the blue light (for example, light having a wavelength of 465 nm) emitted from the blue light-emitting diode 2, and emits the yellow light (light having a wavelength of e.g., 500 to 650 nm). In other words, the fluorescent material 10 converts the blue light into light with a longer wavelength.

In this embodiment, the fluorescent material 10 of single crystal fine grains, in which a crystal defect such as a grain boundary does not exist in a primary grain, can be used to restrain a phenomenon (e.g., temperature quenching) in which the conversion efficiency of the fluorescent material 10 decreases in an environment at high temperature. A conventional fluorescent material can be manufactured by subjecting a material to heat treatment (such as baking). The fluorescent material grows from seed crystals that are nuclei to crystal grains of approximately several μm by heat treatment (refer to FIG. 2). Observing a crystal state of the crystal grain of the fluorescent material which has grown to approximately several μm, a crystal defect such as a grain boundary can exist inside the grain. The crystal defect non-radially emits energy absorbed by the fluorescent material (for example, as heat). Thus, the crystal defect can cause a reduction in the conversion efficiency with temperature. To verify this phenomenon, crystal grains of a fluorescent material were actually crushed. The inside crystal defects were increased on purpose by mechanical stress, and the conversion efficiency of the fluorescent material was measured. It was verified that more crystal defects correlates to a larger reduction rate of the conversion efficiency with temperature.

Figure 3:
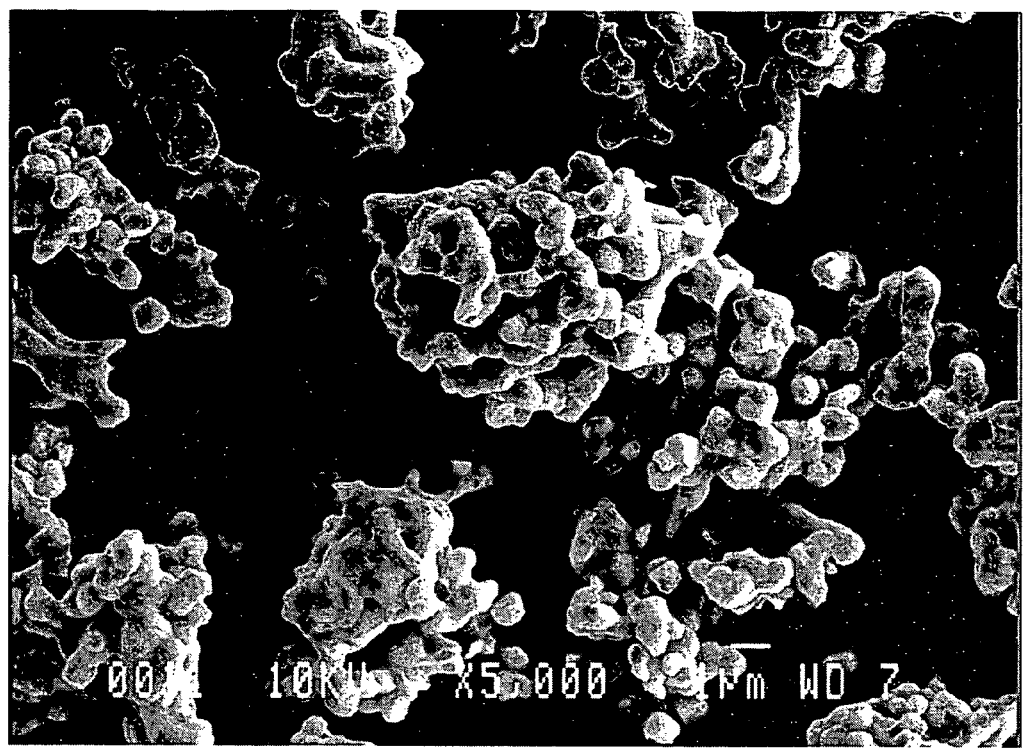
FIG. 3 is a scanning photomicrograph of a fluorescent material that can be used in the embodiment of FIG. 1.

It was found out that stopping crystal growth before a grain grew to a diameter at which an inside grain boundary occurred was effective to obtain a single crystal grain without a crystal defect such as a grain boundary. According to this embodiment, as shown in FIG. 3, the diameter of a primary grain of the fluorescent material 10 can be limited to 1 μm or less in order to restrain a defect such as an inside grain boundary, and to obtain single crystal grains. Thus, it is possible to restrain reduction in the conversion efficiency with temperature caused by a crystal defect. When the primary grain has a diameter of 1 μm or less, each fine grain can be a single crystal. Thus, as shown in FIG. 3, the fine grains may form secondary grains by sintering. On the contrary, the single crystal fine grains can form the secondary grains and the diameter of the secondary grain can exceed 5 μm, as compared with the fine grains that do not form the secondary grains, because the handling of the fluorescent material 10 can be easier due to restraint in the occurrence of agglomeration and static electricity of the fine grains. Therefore, it may be possible to easily measure the fluorescent material 10 and charge it into the resin before curing, during the process of dispersing the fluorescent material 10 in the resin composing the charged section 8.

According to a conventional method for manufacturing a fluorescent material using sintering, however, it is difficult to obtain a single crystal having a diameter of 1 μm or less. In the conventional manufacturing method, oxide particles and metallic salt are combined and mixed in accordance with the composition ratio of a desired fluorescent material, and a mixture is baked. Accordingly, the synthesis and crystal growth of a fluorescent material with desired composition progress at the same time during baking. At this time, if the baking is stopped before the diameter of the crystal particle reaches 1 μm, the synthesis of the fluorescent material may be incomplete, and hence it may be impossible to obtain a fluorescent material with a desired composition and a desired crystal system. If a single crystal of a fluorescent material having a diameter of several μm is crushed to obtain the fluorescent material with the desired composition and the desired crystal system, mechanical stress can cause a crystal defect during the crushing process with the application of stress. Therefore, it may be difficult or impossible to obtain a single crystal fine grain without a crystal defect such as a grain boundary.

In this embodiment, single crystal fine grains of the fluorescent material 10 can be manufactured by using a manufacturing method of fine grains disclosed in, for example, Japanese Patent Application No. 2004-126544. According to this method, ingredients with the composition ratio of a desired material are dissolved in a solvent to make a solution. A polymeric material is contained in this solution to make an ingredient solution containing polymers. The ingredient solution is subjected to heat treatment at a predetermined temperature, in order to generate fine grains of the desired material from the ingredient solution containing polymers. This method is hereinafter called a polymer complex solution method (PCS method). In the PCS method, the polymers can form a polymeric network in the ingredient solution, and nuclei of the fine grains can be generated in this network. The growth of the fine grains advances with respect to the nuclei. As the fine grains grow in the heat treatment, the polymeric material can gradually disappear by pyrolysis. Accordingly, the polymers may not exist in the final fine grains. Since the polymeric network restrains the agglomeration of the fine grains, it is possible to even the size of the generated fine grains. Furthermore, the polymer can function as a heating medium, so that it is possible to slowly grow the fine grains by heat treatment at relatively low temperature (for example, 1000 degrees centigrade or less). Thus, crystals slowly grow while the synthesis of a desired fluorescent material progresses at relatively low temperature. It is possible to obtain the single crystal fine grains of the fluorescent material with desired composition and crystal structure. It is also possible to control the size of the fine grains by adjusting heat retention time and temperature in the heat treatment. Therefore, it is possible to manufacture the fine grains of the fluorescent material in quantity by use of the PCS method by properly adjusting conditions of the heat treatment such as heat retention time and temperature.

Many materials are available as the polymeric material. The material should restrain the agglomeration of the fine grains and function as a heating medium. For example, a polymer having a molecular weight of 400 to 4,000,000 is available. To be more specific, polyethylene glycol, polyvinyl alcohol, polyvinyl pyrrolidone, dextran, or pullulan is available. Each of these polymeric materials may be used alone. Alternatively, a plurality of these polymeric materials may be used in combination. Many solvents are available. The ingredients should be dissolved therein, and, for example, water is available. $BaF_2$, $LiNO_3$, NaCl, KCl, KF, or a mixture thereof may be added to the ingredient solution containing polymers as a flux salt. Using the flux salt and controlling the heat retention time and the temperature make it possible to manufacture fine grains on the order of submicron. When the flux salt is used, the generated fine grains of the fluorescent material can be cleaned to remove the flux salt.

Figure 2:
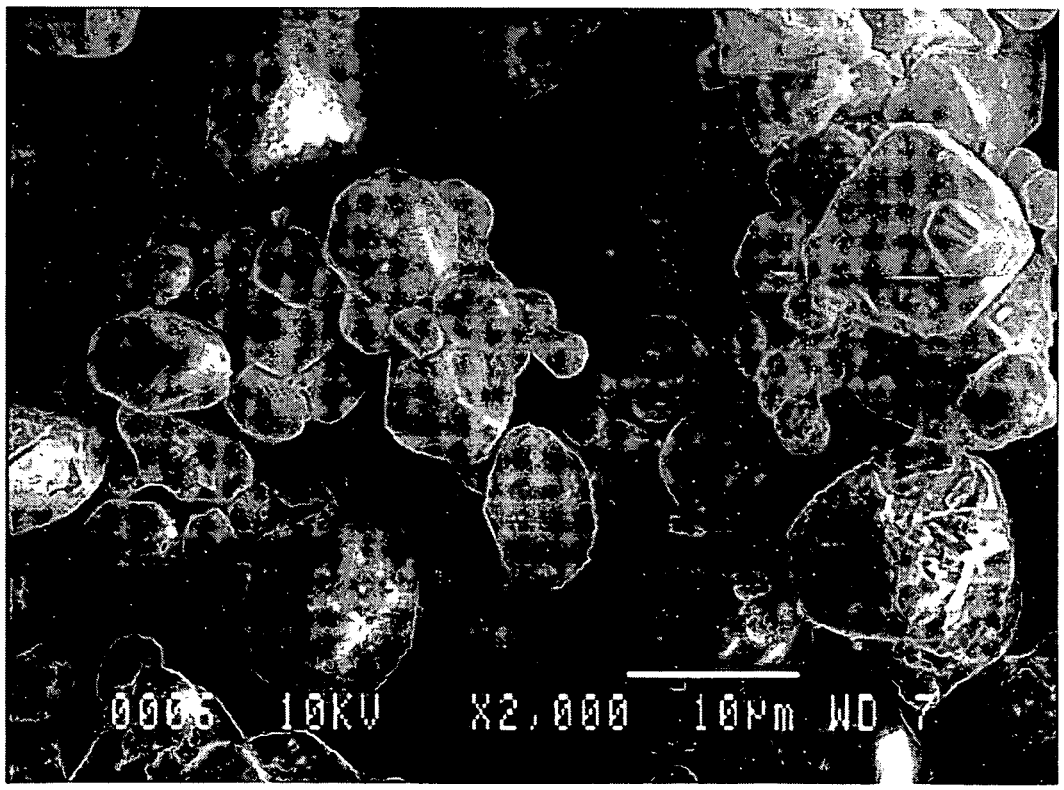
FIG. 2 is a scanning photomicrograph of a fluorescent material in which a diameter of grains is several microns or more obtained by a conventional manufacturing method.
Figure 4:
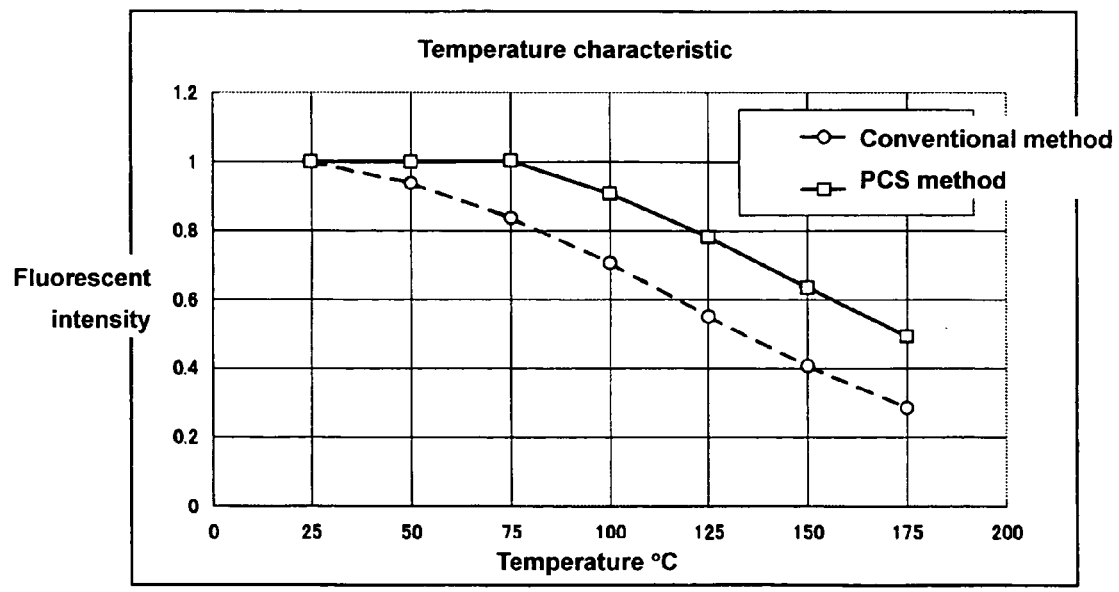
FIG. 4 is a graph showing the temperature dependence of the fluorescent intensity of the fluorescent material used in the embodiment of FIG. 1 and the fluorescent material according to the conventional method.

FIG. 4 shows the measurement results of the temperature dependence of fluorescent intensity from 25 degrees centigrade to 175 degrees centigrade on fluorescent material 10 manufactured by the PCS method and fluorescent material manufactured by the conventional method using baking. Here, the fluorescent intensity at 25 degrees centigrade is set at 1. The fluorescent material 10, as shown in FIG. 3, can include single crystal fine grains in which primary grains have a diameter of 1 μm or less, and secondary grains have a diameter of 5 μm or more. In the fluorescent material manufactured by the conventional method, as shown in FIG. 2, a grain has the same composition as other grains and a diameter of several microns or more. As is apparent from FIG. 4, the reduction ratio of the fluorescent intensity of the fluorescent material 10 (PCS method) according to this embodiment with increase in temperature is smaller than that of the fluorescent material having a diameter of several microns or more according to the conventional method. Since the fluorescent material 10 is dispersed in the resin and charged into the charged section 8, reduction in the light emission efficiency of the fluorescent material can be small in the light-emitting device according to this embodiment, as compared with a conventional light-emitting device, even if the blue light-emitting diode 2 is energized and generates heat. In the light-emitting device according to this embodiment, it is possible to restrain a phenomenon in which a wavelength of emitted white light changes.

In the fluorescent material 10 manufactured by the PCS method, as shown in FIG. 3, the primary grains with a diameter of 1.0 μm or less can form the secondary grains with a diameter of 5.0 μm or more. Since the sedimentation velocity of the fluorescent material 10 is slow, the fluorescent material 10 can be almost evenly dispersed in the resin and cured in that state. Thus, it is possible to easily form a state in which the fluorescent material 10 is almost evenly dispersed in the charged section 8.

Figure 5:
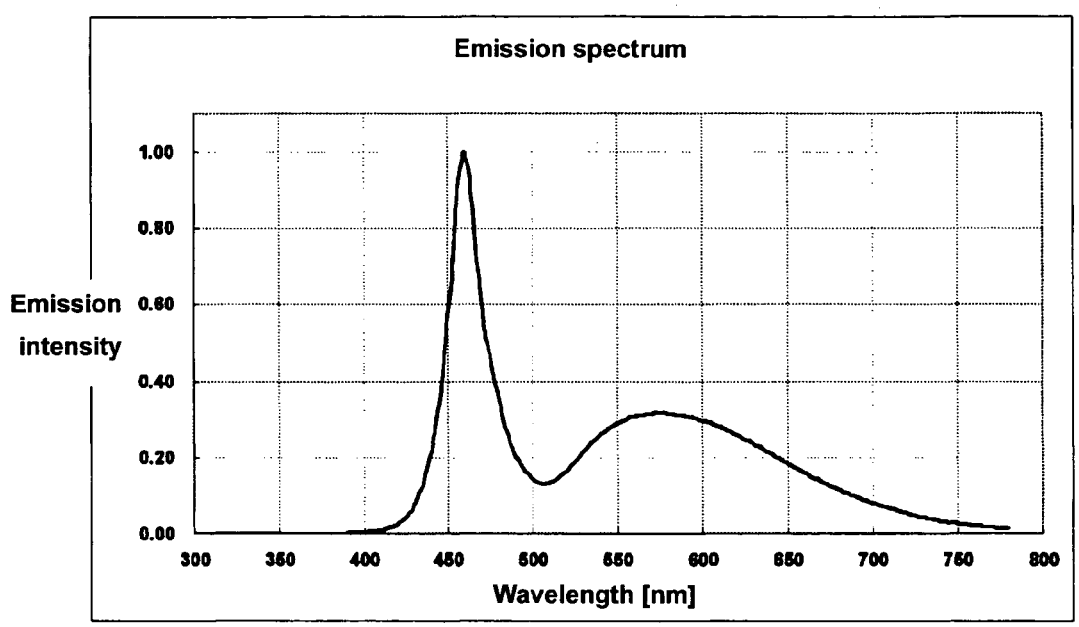
FIG. 5 is a graph showing an emission spectrum of the light-emitting device according to the embodiment of FIG. 1.

Referring to FIG. 5, an emission spectrum of the light-emitting device according to this embodiment was measured. The emission spectrum had a wide width, and showed white light emission.

In the light-emitting device according to this embodiment, fine grains of a fluorescent material manufactured by a method other than the PCS method may be used as a matter of course, and the fluorescent material 10 can include single crystal fine grains in which primary grains have a diameter of 1 μm or less.

The above-described embodiment relates to a so-called normal chip type of light-emitting device shown in FIG. 1.

The present invention can be effectively incorporated in a light-emitting device with any package structure such as a surface mount LED package and a through-hole LED package. Further, the present invention can be applied to a light-emitting device in which a fluorescent material dispersed in a resin converts a wavelength of light emitted from a light source, such as in a light-emitting diode. The present invention is also applicable to a light-emitting device with other structure in which a fluorescent material is fixed by another means instead of a resin. The composition of the fluorescent material 10 is not limited to the foregoing composition. The present invention is applicable if a fluorescent material has other compositions. For example, an yttrium aluminum garnet fluorescent material activated by Ce ($Y_3Al_5O_{12}$:Ce), a terbium aluminum garnet fluorescent material activated by Ce ($Tb_3Al_5O_{12}$:Ce or the like), an alkaline earth metal orthosilicate fluorescent material activated by Eu (($Sr,Ca,Ba)SiO_4$: Eu or the like), or the like is available for use in devices made in accordance with the principles of the invention.

The light-emitting device according to an embodiment of the invention can be available in an indicator lamp, an information display device, a light source for a liquid crystal backlight, a light source for a portable compact light, an interior light, an outdoor light, a traffic light, a light for an automobile or other vehicle, a light for growing plants, and the like.

EXAMPLE

An example of a particular embodiment of the invention will be hereinafter described. A light-emitting device according to the example can have a device structure as shown in FIG. 1. A fluorescent material 10 made of $(Y,Gd)_3Al_5O_{12}$:Ce can include single crystal fine grains in which primary grains have a diameter of 1 μm or less, and secondary grains have a diameter of 51 μm or more.

The fluorescent material 10 can be manufactured by the PCS method. An yttrium nitrate, a gadolinium nitrate, an aluminum nitrate, and a cerium nitrate in the ratio corresponding to the composition of the final fluorescent material, can be dissolved in ultrapure water to make an ingredient solution. The concentration of the ingredient solution can be 0.3M to 2.0M. The doping concentration of cerium with respect to the composition of the final fluorescent material can be set at 1.0 atm. %. Polyethylene glycol (PEG, a molecular weight of 20000) can be mixed with the ingredient solution as a polymer to make a solution containing polymer. At this time, the concentration of the polymer can be 0.01 M to 0.04 M. $BaF_2$ can be contained in the ingredient solution as a flux salt, if necessary or desired.

The prepared ingredient solution can be put into a crucible (a capacity of 30 ml), and heated at 1000 to 1500 degrees centigrade by use of a heating device such as a muffle furnace (made by Koyo Thermo Systems Co., Ltd). A heating rate can be 30 to 3.6 degrees centigrade/min, and heat retention time can be 0 to 340 min. In such a manner, the single crystal fine grains made of $(Y,Gd)_3Al_5O_{12}$:Ce can be obtained, in which primary grains have a diameter of 1 μm or less.

The polymer which can be gradually, thermally decomposed by the heat treatment should not remain after the completion of the heating process. When flux salt is added to the ingredient solution, ultrasonic cleaning can be carried out on the fine grains with ultrapure water, a nitric acid, or ethanol to remove the flux salt therefrom. Then, centrifugal separation can be carried out at 15000 rpm by use of a device such as a refrigerated microcentrifuge. This operation can be repeated four times, and then the fine grains can be cleaned once with ethanol. After the completion of the centrifugal separation, the wet grains can be dried at 50 degrees centigrade.

The grains of the fluorescent material 10 that are obtained can form secondary grains with a diameter of 5.0 μm or more due to sintering of single crystal fine grains with a diameter of 1.0 μm or less (refer to FIG. 3).

Next, the manufacturing process of the light-emitting device shown in FIG. 1 will be described.

Electrodes 6 and 7 can be formed on a substrate 5 in advance by plating an aluminum plate with silver. Then, a case 1 made of a resin with high reflectivity can be attached to the substrate 5. A blue light-emitting diode 2 (a dominant wavelength of light emission: 465 nm) can be fixed in the center of the case 1, and the blue light-emitting diode 2 can be connected to the electrodes 6 and 7 with gold wires 3 and 4.

The fluorescent material 10 obtained by the foregoing method can be dispersed in a transparent thermosetting epoxy resin at a weight ratio of 7 wt %. Then, the resin can be charged into the case 1, and subjected to a heat treatment at 150 degrees centigrade for eight hours, so that the resin can be cured and a charged section 8 formed.

Figure 6:
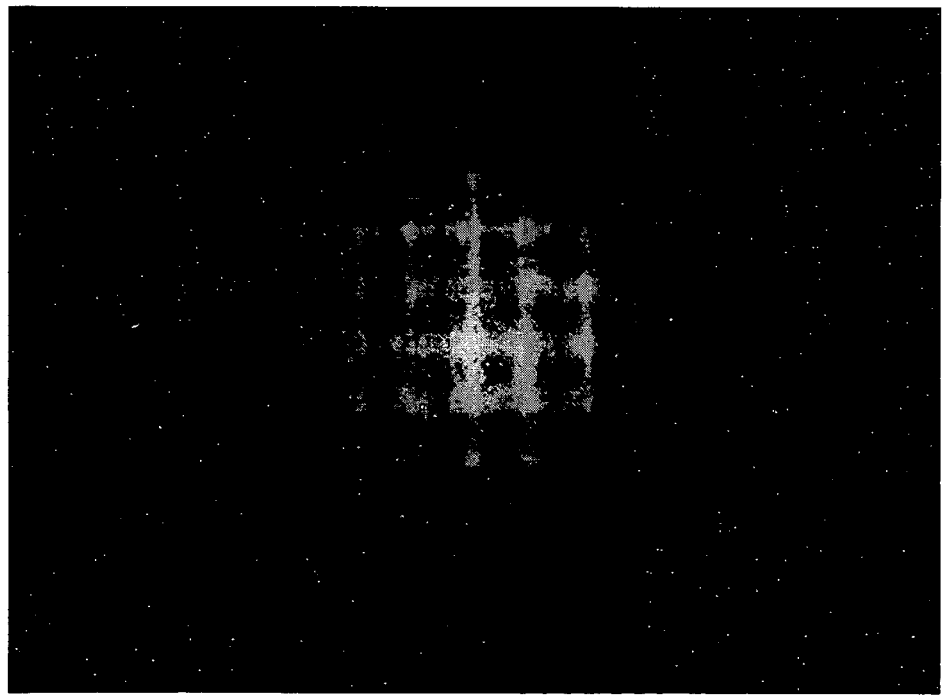
FIG. 6 is a photograph showing a light-emitting state of the light-emitting device embodiment of FIG. 1.
Figure 7:
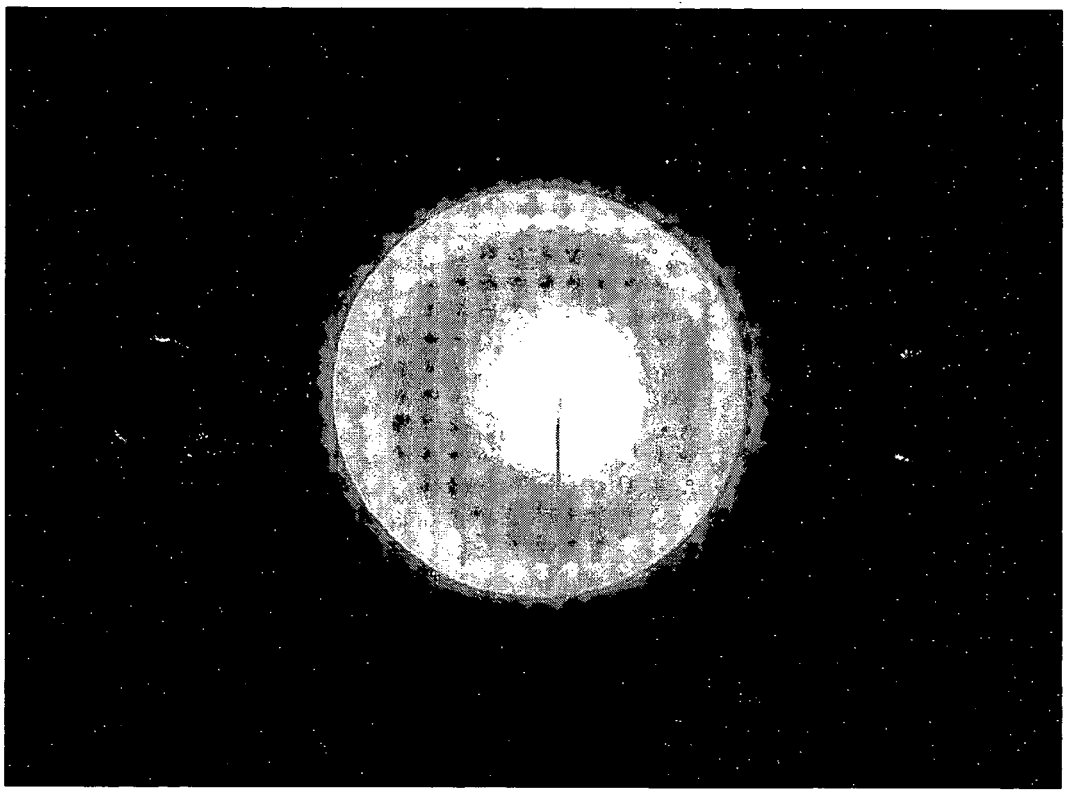
FIG. 7 is a photograph showing a light-emitting state of a light-emitting device which is manufactured by use of the fluorescent material according to the conventional method as a comparative example.

Observing a cross section of the completed light-emitting device, it can be verified that the fluorescent material is almost evenly dispersed in the transparent resin. As a comparative example, on the other hand, a light-emitting device can be manufactured by use of a fluorescent material (refer to FIG. 2) with a diameter of several microns or more manufactured by a conventional method. Observing a cross section of the device, it can be discovered that a portion or all of the fluorescent material became sediment in the bottom of the charged section 8. When a light-emitting state of the light-emitting device according to the previously described example embodiment of the invention is observed from the top face of the charged section 8, as shown in FIG. 6, the light-emitting state can be extremely even with little color unevenness. In contrast, as shown in FIG. 7, a light-emitting state of the light-emitting device according to the comparative example can be uneven with much color unevenness.

Since the fluorescent material 10 according to the above-described embodiment of the invention can have stable temperature characteristics, reduction in the light emission efficiency of the fluorescent material due to heat from the diode can be small if a large electric current flows through the blue light-emitting diode. Thus, it may be possible to realize an efficient light-emitting device with little color variation. The diameter of the grains of the fluorescent material 10 can be small, and the fluorescent material 10 can be almost evenly dispersed in the charged section 8. Accordingly, it may be possible to realize the light-emitting state with low luminance unevenness and little color unevenness. Therefore, a stable product with low unevenness in luminance and in color can be manufactured at low cost.

While there has been described what are at present considered to be exemplary embodiments of the invention, it will be understood that various modifications may be made thereto, and it is intended that the appended claims cover all such modifications as fall within the true spirit and scope of the invention.

Having described embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A light-emitting device comprising:
a light-emitting section for emitting light with a predetermined wavelength; and
a fluorescent material located adjacent the light emitting section and configured to absorb a part of light emitted from the light-emitting section and to emit light with a different wavelength, the fluorescent material including single crystal grains in which a grain boundary does not exist in primary grains of the single crystal grains.

2. The light-emitting device according to claim 1, wherein the fluorescent material includes secondary grains formed by the primary grains and having a diameter of 5 μm or more.

3. A light-emitting device comprising:
a substrate having a pair of electrodes;
a light-emitting section connected to the pair of electrodes and disposed adjacent the substrate, the light-emitting section configured to emit light with a predetermined wavelength;
a light conversion section formed adjacent the light-emitting section, the light conversion section including a fluorescent material, the fluorescent material configured to absorb at least a part of the light emitted from the light-emitting section and to convert the light into light with a longer wavelength, the fluorescent material including single crystal grains in which a grain boundary does not exist in primary grains of the single grain crystals.

4. The light-emitting device according to claim 3, further comprising:
a reflecting section located adjacent the substrate so as to substantially surround the light-emitting section, the reflecting section configured to reflect the light emitted from the light-emitting section and the light from the light conversion section.

5. The light-emitting device according to claim 3, wherein the fluorescent material includes secondary grains formed by the primary grains and having a diameter of 5 μm or more.

6. The light-emitting device according to claim 3, wherein the light conversion section surrounds the light emitting section.

* * * * *